United States Patent
Fitch et al.

(10) Patent No.: US 11,965,846 B2
(45) Date of Patent: Apr. 23, 2024

(54) SYSTEM AND METHOD FOR DETECTING CONTAMINATION IN TWO-PHASE IMMERSION COOLING SYSTEMS BASED ON TEMPERATURE

(71) Applicant: Dell Products L.P., Round Rock, TX (US)

(72) Inventors: Jon Taylor Fitch, Austin, TX (US); Steven Embleton, Austin, TX (US); David Lyle Moss, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 524 days.

(21) Appl. No.: 17/239,163

(22) Filed: Apr. 23, 2021

(65) Prior Publication Data

US 2022/0341860 A1 Oct. 27, 2022

(51) Int. Cl.
   *G01N 25/02* (2006.01)
   *F28F 27/00* (2006.01)
   *H05K 7/20* (2006.01)

(52) U.S. Cl.
   CPC .......... *G01N 25/02* (2013.01); *F28F 27/00* (2013.01); *H05K 7/203* (2013.01); *H05K 7/20818* (2013.01)

(58) Field of Classification Search
   CPC ..... F28F 27/00; G01N 25/02; H05K 7/20236; H05K 7/203; H05K 7/20818
   See application file for complete search history.

(56) References Cited

U.S. PATENT DOCUMENTS 7,362,448 B1 * 4/2008 Liu .................... G01B 11/0625
  356/504
9,921,622 B2   3/2018 Shelnutt et al.
(Continued)

FOREIGN PATENT DOCUMENTS

EP      3731611 A1 * 10/2020
JP    2003247812       9/2003
(Continued)

OTHER PUBLICATIONS

Flinn, Jason, and Mahadev Satyanarayanan. "Energy-aware adaptation for mobile applications." ACM SIGOPS Operating Systems Review 33.5 (1999): 48-63, 1999.
(Continued)

*Primary Examiner* — Eric S Ruppert
*Assistant Examiner* — Hans R Weiland
(74) *Attorney, Agent, or Firm* — McDermott Will & Emery LLP

(57) ABSTRACT

A system for detecting contamination in a two-phase immersion cooling system based on temperature differences between component surface temperature and fluid temperature, a previous component surface temperature and a present component surface temperature and a component surface temperature and a component surface temperature threshold value. Large differences between the component surface temperature and the fluid temperature or between the component surface temperature and a previous component surface temperature or a component surface temperature exceeding a component surface temperature threshold value may indicate contaminants in the fluid that are inhibiting the ability for the component to effectively transfer heat to the fluid. A temperature monitoring system may monitor the temperatures and communicate with a service system to (Continued)

apply corrective measures before the residue can cause significant damage to an information handling system.

15 Claims, 6 Drawing Sheets

(56) References Cited

U.S. PATENT DOCUMENTS

| | | |
|---|---|---|
| 2007/0259256 A1 | 11/2007 | Le Canut et al. |
| 2009/0260777 A1 | 10/2009 | Attlesey |
| 2014/0216711 A1* | 8/2014 | Shelnutt .............. F28D 15/0266 |
| | | 165/104.19 |
| 2018/0288906 A1 | 10/2018 | Hopton et al. |
| 2020/0001513 A1 | 1/2020 | Jones et al. |
| 2020/0093026 A1* | 3/2020 | Enright .................... B25J 9/026 |
| 2020/0093038 A1* | 3/2020 | Enright ............. H05K 7/20318 |
| 2020/0406175 A1* | 12/2020 | Lau ........................ B01D 5/009 |
| 2021/0102294 A1 | 4/2021 | Miljkovic et al. |
| 2021/0219455 A1 | 7/2021 | Lau |
| 2022/0268855 A1* | 8/2022 | Fitch ...................... G01R 31/52 |
| 2022/0400584 A1* | 12/2022 | Enright ............. H05K 7/20818 |
| 2023/0324322 A1* | 10/2023 | Tuma .................... H05K 7/203 |
| | | 73/61.41 |

FOREIGN PATENT DOCUMENTS

| | | |
|---|---|---|
| KR | 2014/0140039 | 12/2014 |
| WO | 9915881 | 4/1999 |
| WO | 2009/022649 | 11/2010 |
| WO | 2015/074669 | 5/2015 |

OTHER PUBLICATIONS

Aguilar-Saborit, Josep, et al. "Dynamic adaptive data structures for monitoring data streams." Data & Knowledge Engineering 66.1 (2008): 92-115, 2008.

Masanet, Eric, et al. "Recalibrating global data center energy-use estimates." Science 367.6481 (2020): 984-986, 2020.

QTS, "Green Data Centers—Scaling environmental sustainability for business and oncsumers collectively." https://www.networkworld.com/article/3569189/green-data-centers-scaling-environmental-sustainability-for-business-and-consumers-collectively.html, Jul. 30, 2020, 2020.

P. E. Tuma, "Design considerations relating to non-thermal aspects of passive 2-phase immersion cooling," *2011 27th Annual IEEE Semiconductor Thermal Measurement and Management Symposium*, San Jose, CA, 2011, pp. 1-9, 2011.

H. Coles, M. Herrlin, Immersion Cooling of Electronics in DoD Installations, Ernest Orlando Berkeley National Laboratory Report LBNL-100566, May 2016, 2016.

Husam Alissa, Mark Shaw, Liquid Immersion Optimized Servers, Presentation at Open Compute Forum San Jose CA Mar. 3-4, 2020, 2020.

* cited by examiner

| EVENT | ΔT EFFECT | CORRECTIVE MEASURE(S) |
|---|---|---|
| REPLACE 1 MEMORY MODULE | + 1C  1120-1 | CHECK FILTER |
| REPLACE 1 GPU CARD | ≈ 2C  1120-2 | REPLACE FILTER |
| REPLACE 2 GPU CARDS | + 4C  1120-3 | REPLACE FLUID AND FILTER |
| REPLACE INFORMATION HANDLING SYSTEM | + 7C  1120-4 | REPLACE FILTER AND FLUID (2X) |

SYSTEM AND METHOD FOR DETECTING CONTAMINATION IN TWO-PHASE IMMERSION COOLING SYSTEMS BASED ON TEMPERATURE

BACKGROUND

Field of the Disclosure

This disclosure relates generally to immersion cooling and, more particularly, to systems for detecting contamination in two-phase immersion cooling systems based on temperature.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Some information handling systems use cooling systems with two-phase fluids to directly remove heat from components. Heat causes the two-phase fluid to change from a first phase (the liquid phase) to a second phase (the vapor phase), wherein the fluid is selected based on a boiling point determined to maintain a component temperature at or below a threshold temperature. The presence of residues may indicate there are contaminants in two-phase immersion cooling systems.

Some components in information handling systems may have surfaces that are etched, have a boiling enhancement coating (BEC) or otherwise be configured to have increased surface area for improved heat transfer to the two-phase fluid.

Embodiments disclosed herein may be generally directed to methods for monitoring a component surface temperature and a fluid temperature at a distance from the component surface to determine if residues are forming on the component.

Embodiments disclosed herein may be generally directed to methods for monitoring a component surface temperature and comparing the component surface temperature with a component surface temperature threshold value to determine if residues are forming on the component.

Embodiments disclosed herein may be generally directed to methods for monitoring a component surface temperature and comparing the component surface temperature with a previous component surface temperature value to determine if residues are forming on the component.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
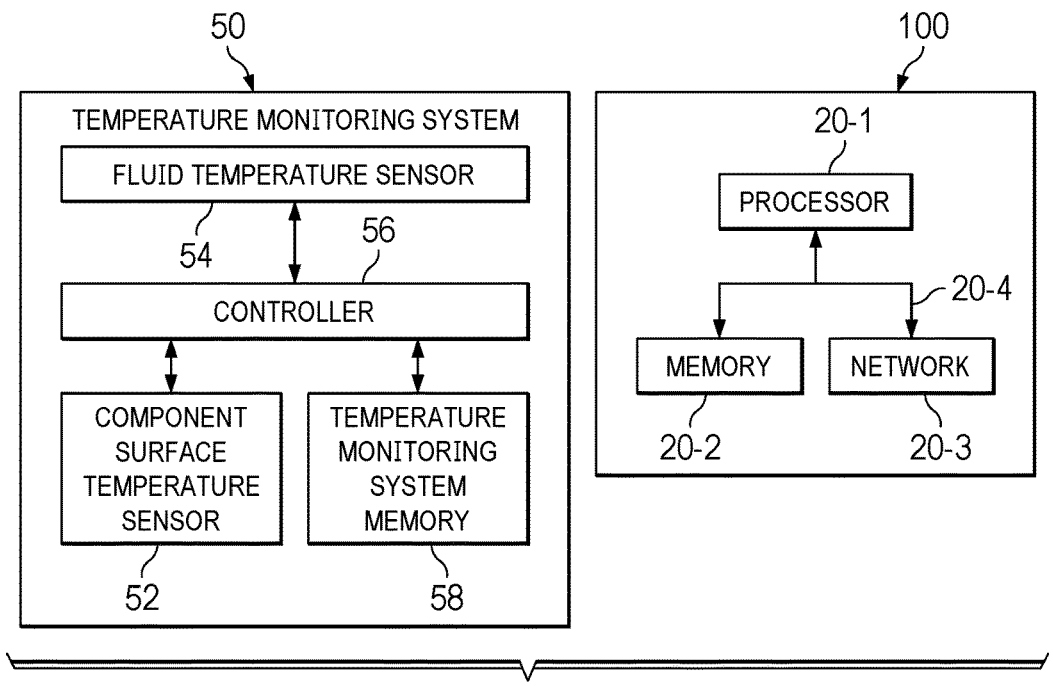
FIG. 1 is a block diagram of selected components of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, component "20-1" refers to an instance of a component, which may be referred to collectively as components "20" and any one of which may be referred to generically as component "20."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices and one or more communications ports for communicating with external devices. The information handling system may also include one or more buses operable to transmit communication between the various hardware components.

Embodiments disclosed herein are described with respect to immersion cooling systems configured for direct cooling of heat-generating components of information handling systems installed in tanks containing two-phase fluids. Particular embodiments are best understood by reference to FIGS. 1-11, wherein like numbers are used to indicate like and corresponding parts.

Referring to FIG. 1, an information handling system such as information handling system 100 may include processor components 20-1, memory components 20-2 and network components 20-3, along with bus components 20-4 or other systems for connecting components 20 on information handling system 100.

Processor components 20-1 may comprise systems, devices, or apparatuses operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor components 20-1 may interpret and execute program instructions and process data stored locally (e.g., in a memory subsystem). In the same or alternative embodiments, processor components 20-1 may interpret and execute program instructions and process data stored remotely (e.g., in a network storage resource).

Memory components 20-2 may comprise systems, devices, or apparatuses operable to retain and retrieve program instructions and data for a period of time (e.g., computer-readable media). Memory components 20-2 may comprise random access memory (RAM), electrically erasable programmable read-only memory (EEPROM), a PCM-CIA card, flash memory, magnetic storage, opto-magnetic storage, and/or a suitable selection and/or array of volatile or non-volatile memory that retains data after power to its associated information handling system is powered down.

Network components 20-3 may comprise systems, devices, or apparatuses operable to serve as an interface between information handling system 100 and a network (not shown). Network components 20-3 may enable information handling system 100 to communicate over a network using a suitable transmission protocol or standard. In some embodiments, a network interface may be communicatively coupled via a network to a network storage resource (not shown). A network coupled to a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to a network interface or various network components 20-3 associated therewith may be implemented using hardware, software, or any combination thereof.

Bus components 20-4 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Information handling system 100 may be communicatively coupled to temperature monitoring system 50 comprising component surface temperature sensor 52, fluid temperature sensor 54, controller 56 and temperature monitoring system memory 58, discussed in greater detail below.

As power and communication enters information handling system 100, the components 20 execute instructions and process information, generating heat. In some configurations of information handling systems 100, processor components 20-1 may be the primary component 20 or subsystem generating heat. In some configurations, information handling systems 100 may form part of large telecom data center switches where network switches 20-3 are the primary component 20 or subsystem generating heat. Other systems may be a data storage center where memory components 20-2 are the primary component 20 or subsystem generating heat.

One approach to cooling components 20 is a two-phase immersion cooling system. In two-phase immersion cooling, one or more information handling systems 100 are immersed in a non-conductive fluid with a low boiling point.

Two-Phase Immersion Cooling System

Figure 2:
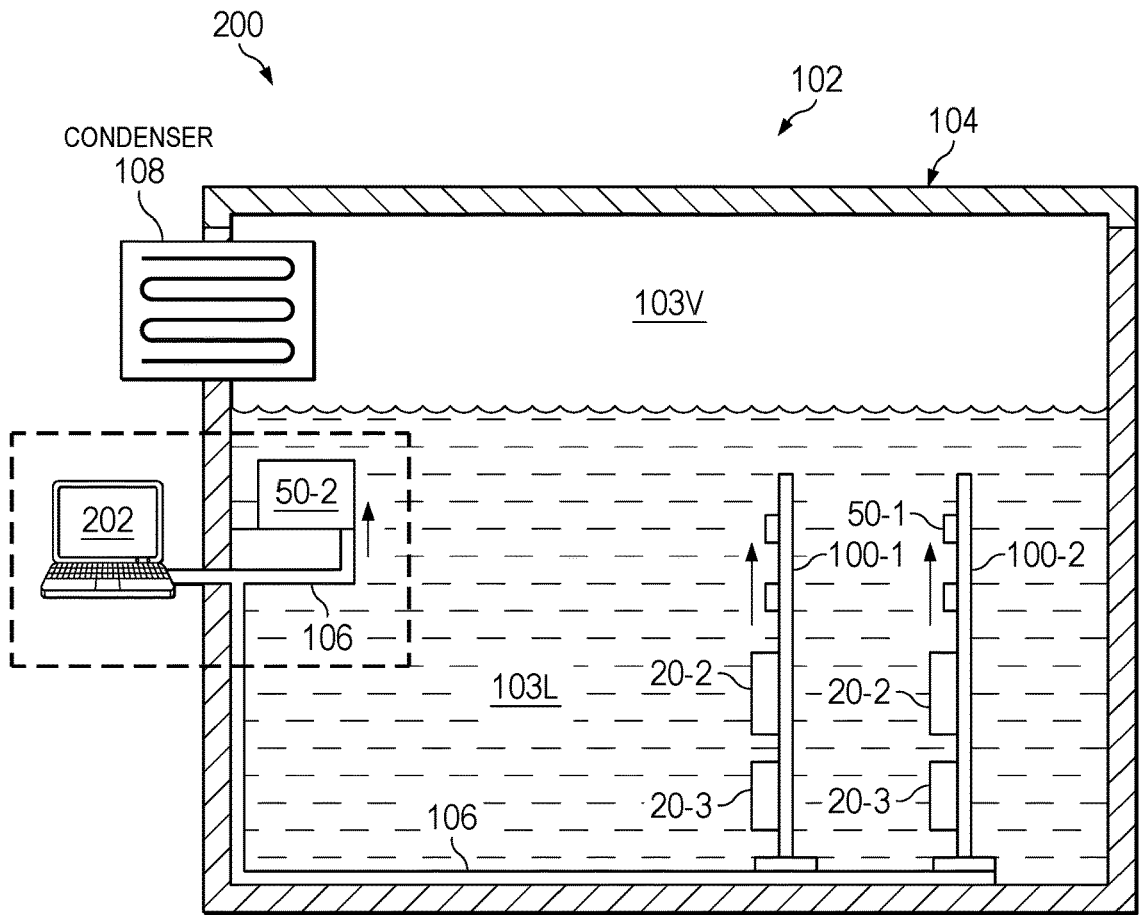
FIG. 2 is a side cutaway view of a two-phase immersion cooling system with multiple information handling systems of FIG. 1 installed therein and embodiments of a temperature monitoring system.

FIG. 2 is side cutaway view of a two-phase immersion cooling system with multiple information handling systems 100 immersed therein. As shown in FIG. 2, a two-phase immersion cooling system 200 may include, but is not limited to, tank 102 containing fluid 103 with lid 104, cables 106, heat exchanger 108 and service system 202. Two phase immersion cooling system 200 may include temperature monitoring system 50 for monitoring the temperature of fluid 103 and the surface temperature of one or more components 20. In some embodiments, temperature monitoring system 50 may form part of a contaminant or temperature monitoring system.

Tank 102 contains two-phase fluid 103 capable of existing in both a liquid phase (denoted as fluid 103L) and as a vapor (denoted as fluid 103V), wherein "fluid 103" comprises a non-conductive fluid with a low boiling point and includes fluid 103L and fluid 103V. Novec 649 is an example of a two-phase fluid. Novec 649 is non-conductive and has a boiling point of 49 C. Information handling systems 100 may be immersed in Novec 649 and the Novec 649 may remove heat from components 20 based on convection and phase transformation.

Lid 104 allows for installation, removal and servicing of one or more information handling systems 100 in tank 102. When closed, lid 104 seals tank 102 to prevent contaminants from entering fluid 103.

Cables 106 provide power and communication functionality to the components 20 on information handling system 100.

Heat exchanger 108 is configured to remove heat from fluid 103. Contact by fluid 103V with heat exchanger 108 results in condensation, which changes fluid 103V to fluid 103L.

A vapor trap (not shown) may remove water vapor from tank 102 to prevent contamination of fluid 103.

Service system 202 may be communicatively coupled to one or more information handling systems 100 and temperature monitoring systems 50. Service system 202 may store information about immersion cooling system 200 and components 20 or information handling systems 100 immersed therein.

Two-Phase Immersion Cooling— Overview

Using fluid 103 with a low boiling point is effective in removing heat from components 20 and information handling systems 100 due to phase transformation of fluid 103 from a liquid phase to a vapor phase and conduction. When components 20 generate heat, localized boiling of fluid 103L may occur near a component surface, wherein much of the cooling happens because of the phase transformation of fluid 103. As fluid 103L boils, bubbles of fluid 103V form near component 20 and rise to the surface of liquid 103L, which promotes fluid flow past component 20, wherein conduction further cools components 20. Since tank 102 is sealed, fluid 103V may exit fluid 103L but fluid 103V is retained in tank 102.

For some heat generating components 20, a component surface may comprise microstructures such as microfins (not shown) which can increase the surface area and therefore increase the rate of boiling of fluid 103. For some heat generating components 20, a component surface may be etched (not shown) which can increase the surface area and therefore increase the rate of boiling of fluid 103. For some heat generating components 20, a component surface may be treated with a boiling enhancement coating (BEC) (not shown) to form micropores which can increase the surface area and therefore increase the rate of boiling of fluid 103.

Residues—Overview

Two-phase immersion cooling systems are susceptible to problems if contaminants are present in fluid 103. Contaminants may be introduced into fluid 103 when components 20 or information handling systems 100 are added, serviced or replaced. For example, liquid water can solvate contaminates and become corrosive. Contaminants may collect in certain areas of tank 102 relative to information handling systems 100 due to the two-phase immersion cooling process. For example, when fluid 103V condenses into fluid 103L, fluid 103L in some areas of tank 102 may be highly concentrated or pure, causing plasticizers and other contaminants to leach from printed circuit boards (PCBs), cables, plastic parts and other components of information handling system 100 with negative pressures or diffusion through elastomers. Also, when fluid 103L boils to change into fluid 103V, contaminants in the form of residues are distilled out of fluid 103L at the point where the boiling occurs.

Effects of Residues Include Increased Component Operating Temperatures

Residues caused by distilling contaminants out of fluid 103L may negatively affect heat transfer from components 20. For example, residues may be deposited on a component surface, which can decrease the rate at which heat can be transferred out of the component 20. For components 20 with etched component surfaces or boiling enhanced coatings (BEC)s, covering a component surface or filling in the component surface texture with residues will reduce the total surface area of the component surface, further reducing the rate at which heat can be transferred away from component 20. Furthermore, a negative effect associated with one contaminant may combine with negative effects of other contaminants, leading to a cumulative increase in residue formation and/or causing a cascading failure.

An approach to avoiding the unwanted effects of residues is to use materials that do not form contaminants. For example, some materials have been identified that are less likely to leach contaminants when in contact with Novec 649. However, not all materials can be replaced. As a result, contaminants are commonly found in fluids 103 when using two-phase immersion cooling.

An approach to reducing the unwanted effects of residues is to remove the contaminants from fluid 103. Filters are used in an effort to remove contaminants. Activated carbon filters can remove plasticizers that cause oily residues. However, filters might not remove all contaminants and filter capacity can be exceeded if new information handling systems 100 are added to tank 102, an information handling system 100 is replaced or parts containing plastic are added or replaced. Consequences of exceeding the filter capacity may require a technician having to dis-assemble and clean the oily residue out of every ball grid array (BGA), DIMM, CPU, GPU etc., in tank 102 containing information handling systems 100. However, cleaning residue out from underneath BGAs and other components 20 is not always possible such that reversal or remediation of residues is not always possible. As a result, residues present in immersion cooling systems 200 risk permanently damaging BGAs and contact points or leading to failures of components 20 or possibly an entire tank 102 of information handling systems 100.

Early detection of oily residue formation allows technicians to apply corrective actions before permanent damage to information handling systems 100 or components 20 on information handling systems 100 can occur.

Measuring Temperature as an Indicator of Residue

To overcome these problems and others, embodiments of a temperature monitoring system 50 may monitor component surface temperatures and fluid temperatures and use the temperatures to detect residues associated with contaminants in fluid 103.

Figure 3:
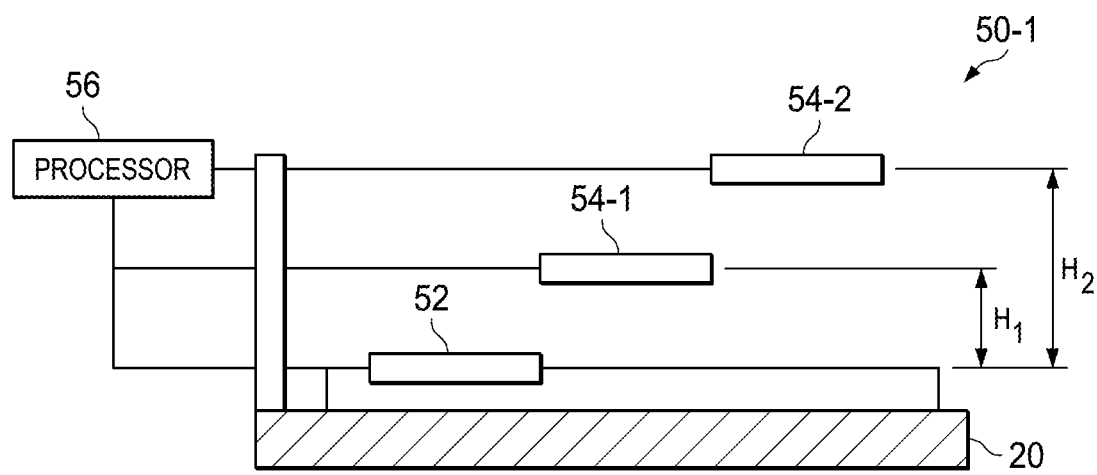
FIGS. 3 and 4 are side views of embodiments of a temperature monitoring system for detecting residue in fluid contained in the two-phase immersion cooling system of FIG. 2.
Figure 4:
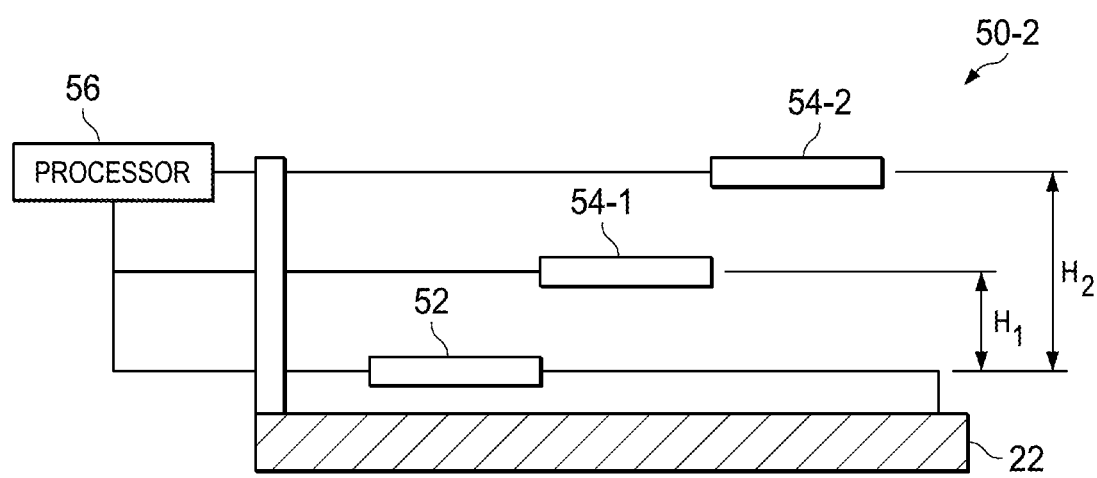

FIGS. 3 and 4 are side views of embodiments of temperature monitoring systems for detecting residue in fluid 103 contained in two-phase immersion cooling systems, wherein detection may be based on a temperature difference between a component surface temperature and a fluid temperature, a temperature difference between a component surface temperature and a baseline component surface temperature, or a temperature difference between a previous component surface temperature and a present component surface temperature.

Temperature Monitoring Systems— Integrated

Referring to FIGS. 2 and 3, embodiments of a temperature monitoring system 50 may be positioned near information handling systems 100 such as temperature monitoring system 50-1 integrated with information handling system 100-

1. Temperature monitoring system 50-1 may include a plurality of temperature sensors, wherein at least one temperature sensor 52 is configured to detect the temperature of a component surface and at least one fluid temperature sensor 54 is positioned in fluid 103L a distance (H) from component 20 and configured to detect the temperature of fluid 103L. Temperature monitoring system 50 may further include processor 56 coupled to each temperature sensor 52, 54, wherein processor 56 is configured to receive signals from component surface temperature sensor 52 and determine a surface temperature for component 20 and receive signals from one or more fluid temperature sensors 54 and determine a temperature of fluid 103L at one or more distances (H) from component 20.

Temperature Monitoring Systems— Stand Alone

Positioning temperature monitoring system 50 away from components 20 may minimize the possibility that temperature monitoring system 50 contributes to an increase in contaminants near components 20. A heat source may allow temperature monitoring system 50 to be positioned away from components 20.

Referring to FIGS. 2 and 4, embodiments of a temperature monitoring system 50 may be positioned away from information handling systems 100 such as temperature monitoring system 50-2 positioned in tank 102 near a condenser but away from information handling system 100-2.

Temperature monitoring system 50-2 may include a plurality of temperature sensors, wherein at least one temperature sensor 52 is coupled to a surface of a heat source 22 and at least one temperature sensor 54 is positioned in fluid 103L a distance from heat source 22. Temperature monitoring system 50 may further include processor 56 coupled to each temperature sensor 52, 54, wherein processor 56 is configured to receive signals from component surface temperature sensor 52 and determine a surface temperature for heat source 22 and receive signals from one or more fluid temperature sensors 54 and determine a temperature of fluid 103L at one or more distances (H) from heat source 22.

Heat source 22 may be configured to generate heat at a known rate and have an associated heat flux, wherein temperature monitoring system 50 may use values for the rate of heat generation and the heat flux to determine if residues are present in fluid 103.

In some embodiments, a measured component surface temperature may be compared against a component baseline temperature value stored in memory. If the measured component surface temperature exceeds the component baseline surface temperature value, the change in component surface temperature may indicate the presence of residue caused by contaminants in fluid 103.

Figure 5:
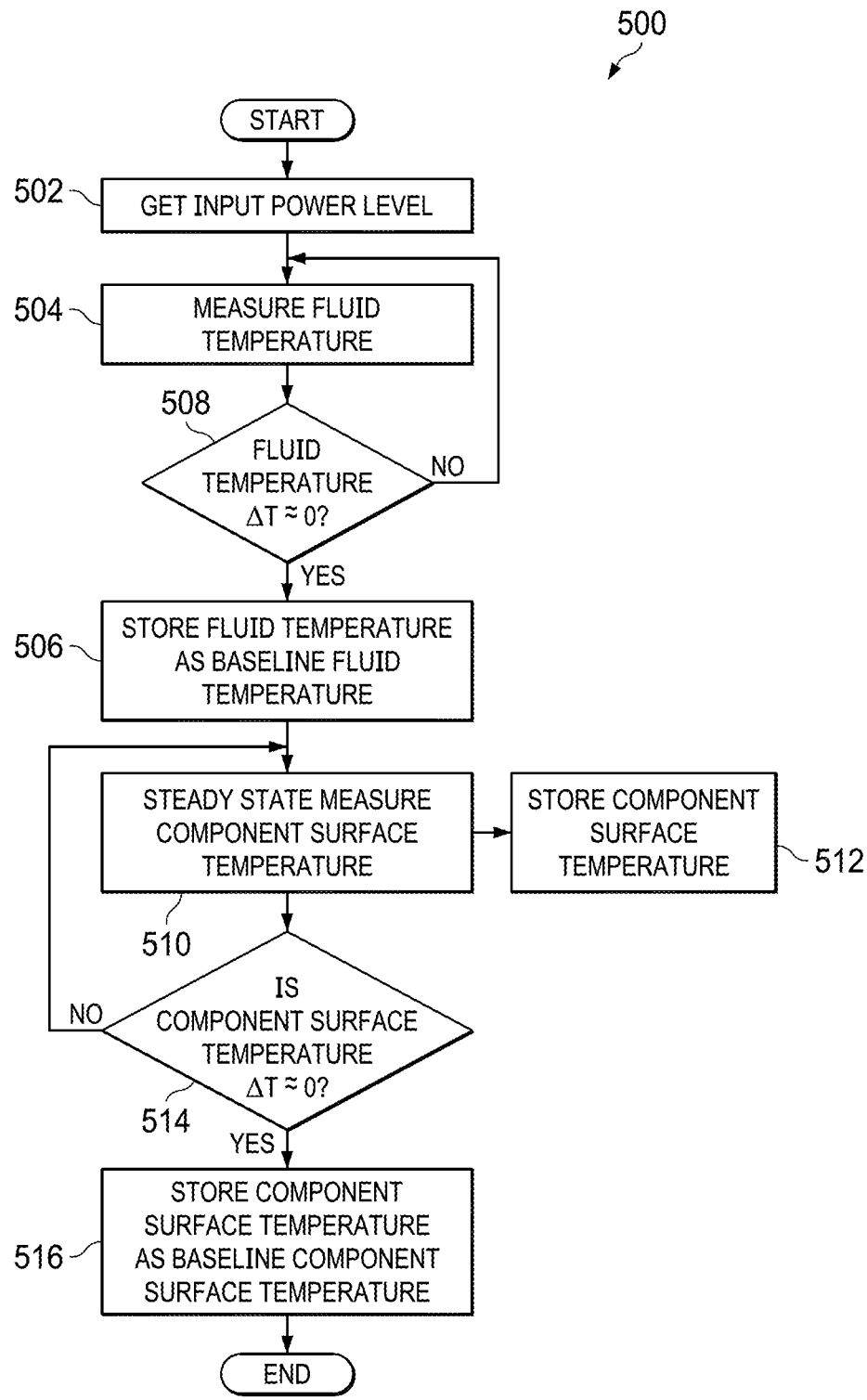
FIG. 5 is a flow diagram illustrating a method for determining baseline temperatures in the two-phase immersion cooling system depicted in FIG. 2.

FIG. 5 is a flow diagram illustrating a method 500 for determining baseline temperatures in a two-phase immersion cooling system such as immersion cooling system 200 depicted in FIG. 2. Method 500 may be performed using embodiments of temperature monitoring system 50.

At step 502, temperature monitoring system 50 determines an input power level. The input power level may be the electric power supplied to information handling system 100 or to one or more components 20 on information handling system 100. Determining an input power level may comprise communicating with information handling system 100 to receive information about the input power level, directly measuring the input power level or inferring the input power level. The input power level may be used to determine a heat flux necessary to cool components 20 in information handling system 100.

At step 504, temperature monitoring system 50 determines a temperature of fluid 103L from fluid temperature sensor 54 positioned a distance (H) from the surface of component 20.

At step 506, temperature monitoring system 50 stores the temperature of the fluid 103L and the input power level in temperature monitoring system memory 58. In some embodiments, a time value is stored with the temperature of the fluid 103L and the input power level.

At step 508, temperature monitoring system 50 compares the temperature of fluid 103L with a previous temperature of fluid 103L to determine if the fluid temperature is changing. If the fluid temperature is increasing, this may indicate fluid 103L is heating up. In some embodiments, the previous temperature corresponds to a baseline fluid temperature previously stored in memory 58. In some embodiments, the previous temperature corresponds to a fluid temperature previously stored with a time value.

Steps 504, 506 and 508 may be repeated until the temperature of fluid 103L reaches a steady state condition such that the fluid temperature and a previous fluid temperature are substantially equal.

At step 510, temperature monitoring system 50 determines a component surface temperature for component 20. In some embodiments, controller 56 communicates with component surface temperature sensor 52 to determine the component surface temperature.

At step 512, temperature monitoring system 50 may record the component surface temperature for component 20 in temperature monitoring system memory 58. In some embodiments, temperature monitoring system 50 records the component surface temperature for component 20 with a time value in temperature monitoring system memory 58

At step 514, temperature monitoring system 50 determines if the component surface temperature for component 20 is changing. If the input power level is constant and the component surface temperature is changing, temperature monitoring system 50 may determine component 20 is not at steady state conditions and may continue performing steps 512 and 514 until the component surface temperature is not changing or is changing only a small amount. In some embodiments, if the input power level is changing and component surface temperature is changing proportionately, temperature monitoring system 50 may determine component 20 is at steady state conditions to allow temperature monitoring and proceed to step 516.

At step 516, temperature monitoring system 50 may store a component surface temperature as a baseline component surface temperature for component 20 in temperature monitoring system memory 58. In some embodiments, temperature monitoring system 50 may store a baseline component surface temperature and an input power level associated with the baseline component surface temperature. In some embodiments, temperature monitoring system 50 may store a baseline component surface temperature, an input power level associated with the baseline component surface temperature and a time needed for the baseline component surface temperature to reach steady state conditions.

Figure 6:
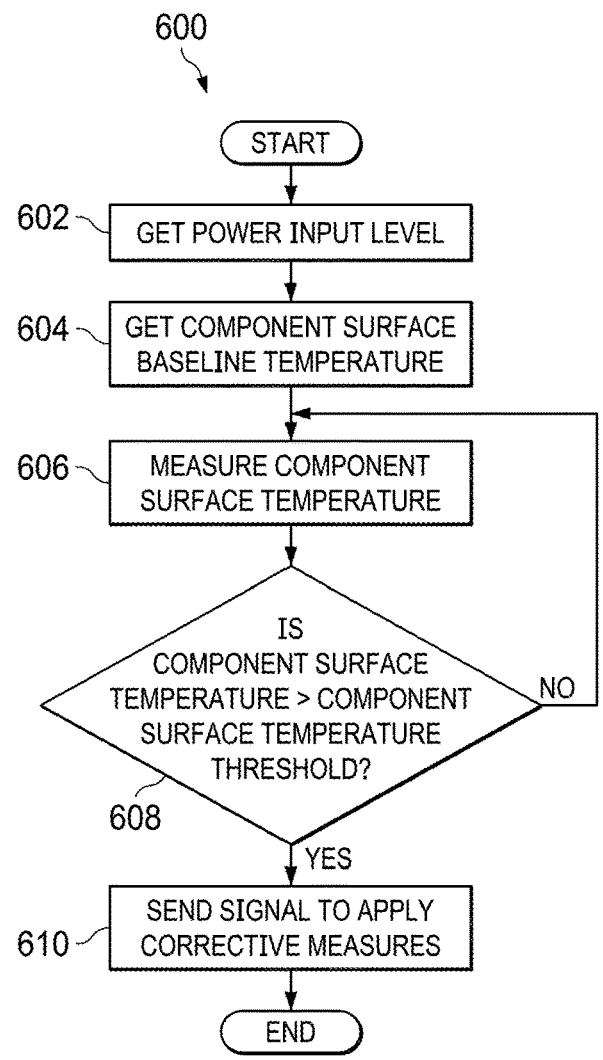
FIG. 6 is a flow diagram illustrating a method for using component surface temperature to detect residue in the two-phase immersion cooling system depicted in FIG. 2.

FIG. 6 is a flow diagram illustrating a method for using component temperatures and/or temperature change to detect residue in a two-phase immersion cooling system such as immersion cooling system 200 depicted in FIG. 2.

At step 602, temperature monitoring system 50 determines an input power level. The input power level may be the electric power supplied to information handling system 100 or to one or more components 20 in information handling system 100. Determining the input power level may comprise communicating with information handling system 100 to receive information about the input power level, directly measuring the input power level or inferring the input power level. The input power level may be used to determine a heat flux necessary to cool components 20 in information handling system 100.

At step 604, temperature monitoring system 50 determines a baseline component surface temperature for component 20. In some embodiments, temperature monitoring system 50 performs method 500 to determine a baseline component surface temperature each time information handling system 100 powers on or two-phase immersion cooling system 200 is serviced. In some embodiments, temperature monitoring system 50 retrieves a baseline component surface temperature from temperature monitoring system memory 58.

At step 606, temperature monitoring system 50 measures a component surface temperature for component 20. In some embodiments, component surface temperature sensor 52 comprises a thermocouple configured to communicate a signal corresponding to a surface temperature of component 20 or heater 22.

At step 608, temperature monitoring system 50 compares the measured component surface temperature with a component surface temperature threshold value retrieved from temperature monitoring system memory 58. The component surface temperature threshold may be a temperature selected based on ensuring residues do not affect the ability of a component surface to transfer heat to fluid 103 at a desired heat flux.

At step 610, if the component surface temperature exceeds the component surface temperature threshold value, temperature monitoring system 50 may communicate a signal to apply corrective measures. Otherwise, temperature monitoring system 50 may continue to monitor the component surface temperature.

Temperature monitoring system 50 may perform method 600 at any time to determine if residue is present on a component surface based on the component surface temperature.

Figure 7:
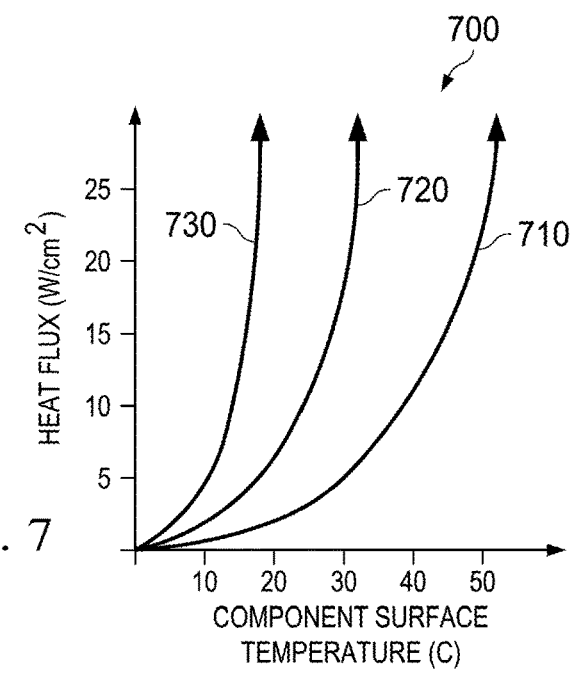
FIG. 7 is a graph of heat flux relative to component surface temperatures, illustrating effects of various surface treatments for components and possible effects of residue on heat transfer associated with these surface treatments.

FIG. 7 is a graph 700 of heat flux relative to component surface temperature for a component 20, illustrating effects of various surface treatments on heat transfer from component 20 to fluid 103 and possible effects of residue on heat transfer from component 20 to fluid 103. As depicted in graph 700, line 710 represents an example relationship between heat flux and component surface temperature for a component 20 having no surface treatment, line 720 represents an example relationship between heat flux and component surface temperature for a component 20 having microfins and line 730 represents an example relationship between heat flux and component surface temperature for a component 20 having a boiling enhancement coating (BEC) or other microstructures.

Considering a given component surface temperature (e.g., 20 C) for a component 20 with no surface structures or BEC, line 710 indicates heat flux may be low (e.g., less than 5 Watts/cm^2), illustrating heat generated by component 20 does not transfer to fluid 103 well. However, for the same component 20 having microstructures, line 720 indicates increased heat fluxes (e.g., approximately 7-8 Watts/cm^2), illustrating an increased surface area of component 20 may improve heat transfer from component 20 to fluid 103. Notably, component 20 having certain microstructures or BEC may have an increase in heat flux such that the surface of component 20 may never reach a selected temperature. For example, for component 20 formed with a surface having a BEC, line 730 indicates component 20 may never reach a component surface temperature of 50 C.

Graph 700 further illustrates possible effects of a residue on a component 20. When contaminants form a residue, the residue may cover the surface and fill in the microstructures or BEC such that the relationship between heat flux and temperature changes. For example, component 20 having a BEC with residue formed thereon may operate along line 730, but may operate along line 720 or line 710 as residues form on the component surface and fill in microstructures or BEC.

In some embodiments, a measured component surface temperature may be compared against a measured fluid temperature value. If the difference between the measured component temperature and the measured fluid temperature value is small, the difference may indicate the presence of residue on a component caused by contaminants in fluid 103. Temperature monitoring system 50 may perform method 600 to determine if residue is present on a component surface based on a difference between a component surface temperature and a previous component surface temperature.

Figure 8:
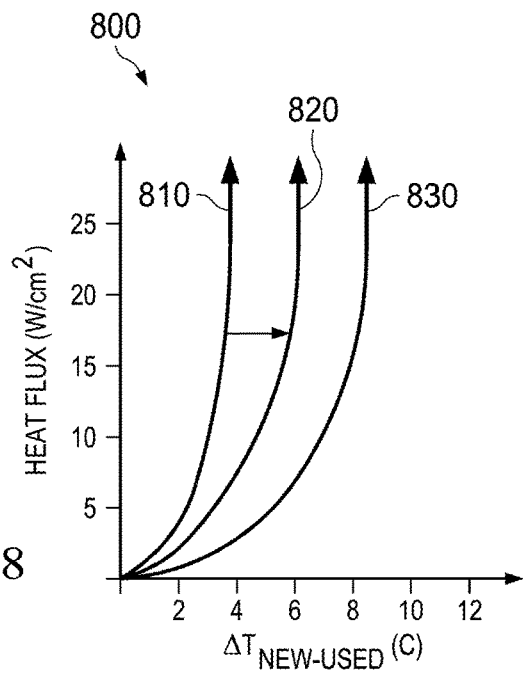
FIG. 8 is a graph of heat flux relative to component surface temperatures, illustrating changes in temperature for components due to residue in the two-phase immersion cooling system of FIG. 2.

FIG. 8 is a graph of heat flux relative to differences in component surface temperatures, illustrating how temperature monitoring system 50 may determine residue is present based on a change in component surface temperature over time. As depicted in FIG. 8, lines 810, 820 and 830 depict heat fluxes for components 20 corresponding to differences in component surface temperatures.

Line 810 may represent heat flux for component 20 having a BEC or microporous structure, microfins or no surface treatment with a small difference between a measured component surface temperature and a baseline component surface temperature retrieved from temperature monitoring system memory 58. Thus, for component 20, line 810 illustrates that a small change in temperature (delta T) between a measured component surface temperature and a baseline component surface temperature may correspond to a large heat flux indicating no contaminants are present in fluid 103 and component 20 is able to efficiently transfer heat to fluid 103.

Line 820 may represent heat flux for component 20 with a larger difference between a measured component surface temperature and a baseline component surface temperature retrieved from temperature monitoring system memory 58. As the number of contaminants increase and residue forms on component 20, the ability of component 20 to transfer heat to fluid 103 may decrease. For component 20, line 820 illustrates that the same heat flux may correspond to a larger difference between the measured component surface temperature and the baseline component surface temperature, indicating contaminants are present in fluid 103 and component 20 is less able to efficiently transfer heat to fluid 103.

Line 830 may represent heat flux for component 20 with a larger difference between a measured component surface temperature and a baseline component surface temperature retrieved from temperature monitoring system memory 58. As the number of contaminants continues to increase and residue builds on component 20, the ability of component 20 to transfer heat to fluid 103 may decrease to a point that the difference between a measured component surface temperature and the baseline component surface temperature may indicate component 20 or information handling system 100 must be serviced or replaced. For component 20, line 830 illustrates that a heat flux may correspond to a larger difference between the measured component surface temperature and the baseline component surface temperature such that corrective action must be taken.

Figure 9:
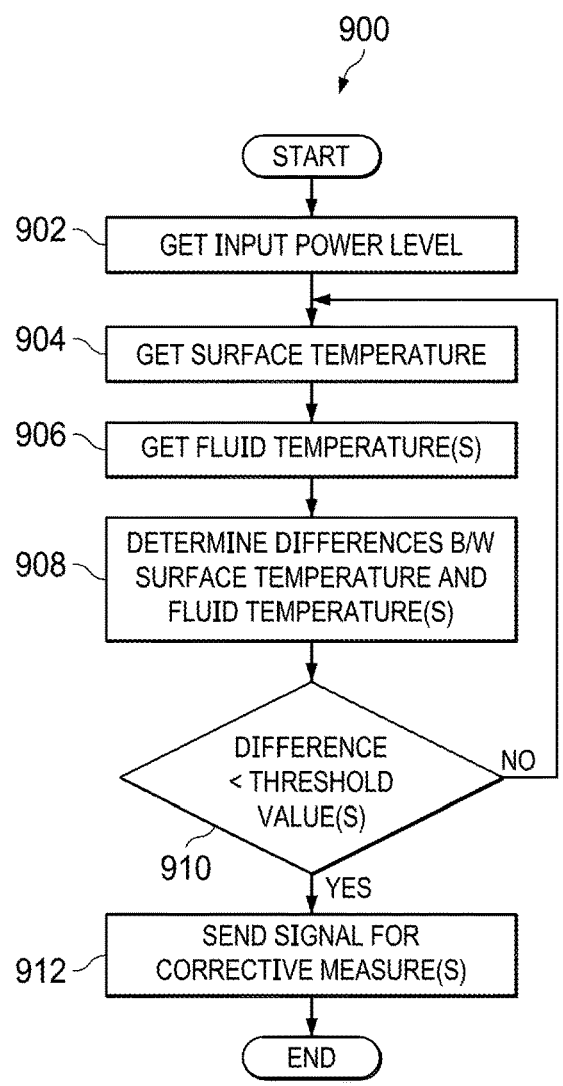
FIG. 9 is a flow diagram illustrating a method for detecting residue in a two-phase immersion cooling system based on a difference between a component surface temperature and a fluid temperature.

FIG. 9 is a flow diagram illustrating a method 900 for detecting residue in a two-phase immersion cooling system based on a difference between a component surface temperature and a temperature of the fluid a distance (H) from the component surface.

At step 902, temperature monitoring system 50 determines an input power level. The input power level may be the electric power supplied to information handling system 100 or to one or more components 20 on information handling system 100. Determining the input power level may comprise communicating with information handling system 100 to receive information about the input power level, directly measuring the input power level or inferring the input power level. The input power level may be used to determine a heat flux necessary to cool components 20 in information handling system 100.

At step 904, temperature monitoring system 50 determines a component surface temperature. Temperature monitoring system 50 may communicate with component surface temperature sensor 52 to determine a component surface temperature of component 20 or heat source 22.

At step 906, temperature monitoring system 50 determines a fluid temperature. Temperature monitoring system 50 may communicate with one or more fluid temperature sensors 54 to determine a fluid temperature. In some embodiments, multiple fluid temperature sensors 54 may be used to ensure fluid 103 is at a steady-state condition.

At step 908, temperature monitoring system 50 calculates a difference between the component surface temperature and the fluid temperature. A small difference between the component surface temperature and the fluid temperature may indicate fluid 103 is efficiently removing heat from a component 20. As a residue builds on a component surface, the difference between the component surface temperature and the fluid temperature will increase, reducing the ability of component 20 to transfer heat to fluid 103.

At step 910, temperature monitoring system 50 may compare the difference between the component surface temperature and the fluid temperature to a temperature difference value. In some embodiments, if the difference between the component surface temperature and the fluid temperature is less than the temperature difference value, temperature monitoring system 50 determines a residue is not present on the component and temperature monitoring system 50 may continuously repeat steps 902-910 to monitor fluid 103 for contaminants.

In some embodiments, if the difference between the component surface temperature and the fluid temperature is greater than the temperature difference value, temperature monitoring system 50 determines a residue is present on component 20. At step 912, temperature monitoring system 50 may communicate with information handling system 100 or service system 202 to apply corrective measures.

Figures 10, 11:
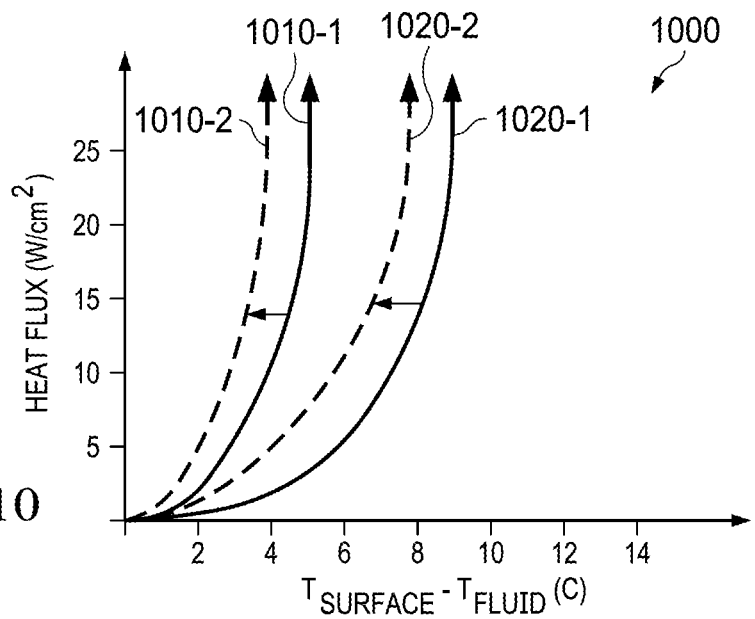
FIG. 10 is a graph of heat flux relative to component surface temperatures, illustrating the effect of residue on heat transfer from components in an information handling system to a two-phase fluid.
FIG. 11 depicts a data structure storing example events associated with an information handling system in a two-phase fluid immersion cooling system and possible corrective measures.

FIG. 10 is a graph 1000 of heat flux relative to differences between component surface temperatures and fluid temperatures, illustrating the effect of residue on heat transfer from components 20 to fluid 103.

Lines 1010-1 and 1020-1 depict heat fluxes relative to temperature difference between component 20 and fluid 103 with contaminants. Lines 1010-2 and 1020-2 depict heat fluxes relative to temperature difference between component 20 and fluid 103 with no contaminants. As illustrated in FIG. 10, when contaminants and residues build up on component surfaces, heat transfer is reduced.

Temperature monitoring system 50 may communicate a signal to information handling system 100 or service system 202 to indicate when corrective measures should be applied to prevent damage to components 20 or entire information handling systems 100.

FIG. 11 depicts a data structure 1100 storing example events associated with the information handling system of FIG. 1 and possible corrective measures based on example temperature changes. Data structure 1100 may comprise event fields 1110, wherein each event field 1110 stores information identifying an event associated with installing, replacing, removing or servicing information handling systems 100 installed in tank 102. Data structure 1100 may comprise effect fields 1120, wherein each effect field 1120 stores information about an effect on the temperature of fluid 103 in tank 102 associated with installing, replacing, removing or servicing information handling systems 100 installed in tank 102. Data structure 1100 may comprise corrective measure fields 1130, wherein each corrective measure field 1130 stores information identifying a corrective measure to be performed in conjunction with installing, replacing, removing or servicing information handling systems 100 installed in tank 102.

For example, event 1110-1 (e.g., installing one memory module 20-2) may introduce contaminants into fluid 103 that can form a residue on a component 20 in tank 102. Component 20 may be a new memory module. The effect 1120-1 of installing one memory module 20-2 may be that component surface temperature increases by 1 C. A corrective measure 1130-1 associated with a 1 C increase in temperature may be to check a filter in tank 102. Depending on the filter age or capacity, a technician may replace the filter.

Still referring to FIG. 11, event 1110-2 (e.g., replacing a GPU card 20-1) may introduce contaminants into fluid 103 that can form a residue on a component 20 in tank 102. Component 20 may be a new GPU card. The effect 1120-2 of replacing one GPU card 20-2 may be that component surface temperature increases by 2 C. A corrective measure 1130-2 associated with a 2 C increase in temperature may be to replace a filter in tank 102.

Still referring to FIG. 11, event 1110-3 (e.g., replacing two GPU cards 20-1 may introduce more contaminants into fluid 103 that are more likely to form a residue on a component 20 in tank 102. Components 20 may be new GPU cards 20-2. The effect 1120-3 of replacing two GPU cards 20-1 may be that component surface temperature increases by 4 C. A corrective measure 1130-3 associated with a 4 C increase in temperature may be to replace the fluid 103 and a filter in tank 102.

Still referring to FIG. 11, event 1110-4 (e.g., replacing an information handling system 100) may introduce contaminants into fluid 103 such that a significant amount of residue is expected to form on components 20 in tank 102 unless more aggressive strategies are implemented. The effect 1120-2 of replacing an information handling system 100 may be that component surface temperatures increase by 7 C. A corrective measure 1130-3 associated with a 7 C increase in temperature may be to replace the fluid 103 and a filter in tank 102, allow fluid 103 to circulate through tank 102 then replace the fluid 103 and filter again.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A system for detecting residue on a component in an information handling system immersed in a two-phase fluid in a tank, the system comprising:
   a component surface temperature sensor configured to measure a component surface temperature for a component and generate a surface temperature signal corresponding to the component surface temperature;
   a fluid temperature sensor positioned a distance from the component and configured to measure a fluid temperature and generate a fluid temperature signal corresponding to the fluid temperature; and
   a processor coupled to the component surface temperature sensor and the fluid temperature sensor and configured to:
   receive the surface temperature signal from the component surface temperature sensor and determine a component surface temperature based on the surface temperature signal;
   receive a fluid temperature signal from the fluid temperature sensor and determine a fluid temperature based on the fluid temperature signal;
   determine residue is present by performing one or more of:
   calculating a difference between the component surface temperature and the component surface temperature threshold value and determining the component surface temperature exceeds the component surface temperature threshold value,
   calculating a change in the component surface temperature over time and determining the change in component surface temperature over time exceeds a component surface temperature change value, and
   calculating a difference between the component surface temperature and the fluid temperature and determining the difference between the component surface temperature and the fluid temperature is more than a temperature difference value; and
   communicate a signal that residue is present based on one or more of the component surface temperature exceeding the component surface temperature threshold value, the change in component surface temperature over time exceeding the surface temperature change value or the difference between the component surface temperature and the fluid temperature being more than the temperature difference value.

2. The system of claim 1, wherein the component comprises a heat source.

3. The system of claim 1, wherein one or more of the component surface temperature sensor and the fluid temperature sensor comprises a thermocouple.

4. The system of claim 1, wherein the processor is further configured to:
   determine a first fluid temperature at a first time;
   determine a second fluid temperature at a second time;
   determine a difference between the first fluid temperature and the second fluid temperature; and
   determine the fluid is at a steady state condition when the difference between the first fluid temperature and the second fluid temperature is approximately zero.

5. The system of claim 4, wherein the processor is further configured to:
   determine a first component surface temperature at a first time;
   determine a second component surface temperature at a second time;
   determine a difference between the first component surface temperature and the second component surface temperature; and
   determine the component is operating at a steady state condition when the difference between the first component surface temperature and the second component surface temperature is approximately zero.

6. A method for detecting contaminants in a two-phase fluid in a tank, the method comprising:
   storing a set of baseline component surface temperature measurements for a component, each component surface temperature measurement in the set of baseline component surface temperature measurements corresponding to a component operating at an input power level;
   measuring a component surface temperature for a component and generating a surface temperature signal corresponding to the component surface temperature;
   measuring a fluid temperature and generating a fluid temperature signal corresponding to the fluid temperature; and
   determining residue is present in the fluid by performing one or more of:
   calculating a difference between the component surface temperature and a component surface temperature threshold value and determining the component surface temperature exceeds the component surface temperature threshold value,
   calculating a change in the component surface temperature over time and determining the change in component surface temperature over time exceeds a component surface temperature change value, and
   calculating a difference between the component surface temperature and the fluid temperature and determining the difference between the component surface temperature and the fluid temperature is more than a temperature difference value; and
   communicating a signal that residue is present in the two-phase fluid based on one or more of the component surface temperature exceeding the component surface temperature threshold value, the change in component surface temperature over time exceeding the surface temperature change value or the difference between the component surface temperature and the fluid temperature being more than the temperature difference value.

7. The method of claim 6, further comprising:
   determining a first fluid temperature at a first time;
   determining a second fluid temperature at a second time;
   determining a difference between the first fluid temperature and the second fluid temperature; and
   determining the fluid is at a steady state condition when the difference between the first fluid temperature and the second fluid temperature is approximately zero.

8. The method of claim 7, further comprising:
   determining a first component surface temperature at a first time;
   determining a second component surface temperature at a second time;
   determining a difference between the first component surface temperature and the second component surface temperature; and
   determining the component is operating at a steady state condition when the difference between the first component surface temperature and the second component surface temperature is approximately zero.

9. The method of claim 6, wherein the component comprises a heat source.

10. The method of claim 6, wherein one or more of the component surface temperature sensor and the fluid temperature sensor comprises a thermocouple.

11. An immersion cooling system comprising:
a tank containing a two-phase fluid, the tank configured for immersing an information handling system; and
a temperature monitoring system comprising:
a component surface temperature sensor configured to measure a component surface temperature for a component and generate a surface temperature signal corresponding to the component surface temperature;
a fluid temperature sensor positioned a distance from the component and configured to measure a fluid temperature and generate a fluid temperature signal corresponding to the fluid temperature; and
a processor coupled to the component surface temperature sensor and the fluid temperature sensor and configured to:
receive the surface temperature signal from the component surface temperature sensor and determine a component surface temperature based on the surface temperature signal;
receive a fluid temperature signal from the fluid temperature sensor and determine a fluid temperature based on the fluid temperature signal;
determine a contaminant is present in the fluid by performing one or more of:
calculating a difference between the component surface temperature and the component surface temperature threshold value and determining the component surface temperature exceeds a component surface temperature threshold value,
calculating a change in the component surface temperature over time and determining the change in component surface temperature over time exceeds a component surface temperature change value, and
calculating a difference between the component surface temperature and the fluid temperature and determining the difference between the component surface temperature and the fluid temperature is more than a temperature difference value; and
communicate a signal that residue is present in the two-phase fluid based on one or more of the component surface temperature exceeding the component surface temperature threshold value, the change in component surface temperature over time exceeding the surface temperature change value or the difference between the component surface temperature and the fluid temperature being more than the temperature difference value.

12. The immersion cooling system of claim 11, wherein the component comprises a heat source.

13. The immersion cooling system of claim 11, wherein one or more of the component surface temperature sensor and the fluid temperature sensor comprises a thermocouple.

14. The immersion cooling system of claim 11, wherein the processor is further configured to:
determine a first fluid temperature at a first time;
determine a second fluid temperature at a second time;
determine a difference between the first fluid temperature and the second fluid temperature; and
determine the fluid is at a steady state condition when the difference between the first fluid temperature and the second fluid temperature is approximately zero.

15. The immersion cooling system of claim 14, wherein the processor is further configured to:
determine a first component surface temperature at a first time;
determine a second component surface temperature at a second time;
determine a difference between the first component surface temperature and the second component surface temperature; and
determine the component is operating at a steady state condition when the difference between the first component surface temperature and the second component surface temperature is approximately zero.

* * * * *